United States Patent
Price et al.

(10) Patent No.: US 10,622,068 B2
(45) Date of Patent: Apr. 14, 2020

(54) ELECTRONIC CIRCUIT AND DATA STORAGE SYSTEM

(71) Applicant: Pragmatic Printing LTD., Durham (GB)

(72) Inventors: Richard Price, Durham (GB); Catherine Ramsdale, Cambridgeshire (GB)

(73) Assignee: PRAGMATIC PRINTING LTD, Durham (GB)

( * ) Notice: Subject to any disclaimer, the term of this patent is extended or adjusted under 35 U.S.C. 154(b) by 0 days.

(21) Appl. No.: 16/233,351

(22) Filed: Dec. 27, 2018

(65) Prior Publication Data

US 2019/0130973 A1    May 2, 2019

Related U.S. Application Data

(62) Division of application No. 15/303,982, filed as application No. PCT/GB2015/051129 on Apr. 14, 2015, now Pat. No. 10,204,683.

(30) Foreign Application Priority Data

Apr. 14, 2014    (GB) .................................. 1406654.2

(51) Int. Cl.
  *G11C 13/04*  (2006.01)
  *G11B 11/12*  (2006.01)
  (Continued)

(52) U.S. Cl.
  CPC .............. *G11C 13/047* (2013.01); *G11B 9/04* (2013.01); *G11B 11/08* (2013.01); *G11B 11/12* (2013.01);
  (Continued)

(58) Field of Classification Search
  CPC ................................................ G02F 1/134327
  (Continued)

(56) References Cited

U.S. PATENT DOCUMENTS

2003/0212724 A1    11/2003  Ovshinsky et al.
2004/0037106 A1    2/2004  Lu et al.
(Continued)

FOREIGN PATENT DOCUMENTS

CN    101335258 A    12/2008
CN    101714372 A    5/2010
(Continued)

OTHER PUBLICATIONS

International Search Report & Written Opinion for PCT/GB2015/051129, dated Oct. 1, 2015; 23 pages.
(Continued)

*Primary Examiner* — Jason Lappas
(74) *Attorney, Agent, or Firm* — Pepper Hamilton LLP (57) ABSTRACT

A method of manufacturing an electronic circuit comprises: providing an electronic circuit having a first configuration in which the circuit comprises a resistive element having a first resistance, and irradiating at least a part of the resistive element with electromagnetic radiation to change the resistance of the resistive element from the first resistance to a second resistance, the second resistance being lower than the first resistance. A method of storing data comprises: receiving a piece of data to be stored; determining a number according to the data; and irradiating at least part of a resistive element with that number of pulses of electromagnetic radiation to change a resistance of the resistive element from a first resistance to a second resistance, the second resistance being lower than the first resistance. A difference between the first resistance and the second resistance is dependent on the number. Corresponding circuits and data storage systems are disclosed.

22 Claims, 10 Drawing Sheets

(51) Int. Cl.
*G11C 11/56* (2006.01)
*G11C 13/00* (2006.01)
*G11B 9/04* (2006.01)
*G11B 11/08* (2006.01)
*H01L 45/00* (2006.01)
*H01C 17/242* (2006.01)

(52) U.S. Cl.
CPC ...... *G11C 11/5685* (2013.01); *G11C 13/0002* (2013.01); *G11C 13/004* (2013.01); *G11C 13/0007* (2013.01); *G11C 13/0069* (2013.01); *G11C 13/044* (2013.01); *H01C 17/242* (2013.01); *H01L 45/04* (2013.01); *H01L 45/1213* (2013.01); *H01L 45/1226* (2013.01); *H01L 45/146* (2013.01)

(58) Field of Classification Search
USPC ........................................................ 359/296
See application file for complete search history.

(56) References Cited

U.S. PATENT DOCUMENTS

| | | | |
|---|---|---|---|
| 2005/0030784 A1 | 2/2005 | Johnson | |
| 2006/0256424 A1* | 11/2006 | Hou | G02F 1/134327 359/296 |
| 2007/0069246 A1 | 3/2007 | Koch et al. | |
| 2007/0153570 A1 | 4/2007 | Suh | |
| 2007/0133272 A1 | 6/2007 | Yu et al. | |
| 2010/0061141 A1 | 3/2010 | Hwang | |
| 2011/0242873 A1 | 10/2011 | Bratkovski et al. | |
| 2014/0048806 A1 | 2/2014 | Price et al. | |

FOREIGN PATENT DOCUMENTS

| | | |
|---|---|---|
| CN | 102682649 | 9/2012 |
| JP | 03102803 A | 4/1991 |
| JP | 05121687 A | 5/1993 |
| JP | 2011009415 A | 1/2011 |
| JP | 2014029976 A | 2/2014 |
| WO | 2008069056 A1 | 6/2008 |
| WO | 2012131395 A1 | 10/2012 |

OTHER PUBLICATIONS

International Preliminary Report on Patentability for PCT/GB2015/051129, dated Oct. 18, 2016; 16 pages.

Search Report and Examination Opinion for Application No. GB 1406654.2, dated Oct. 17, 2014; 4 pages.

Examination Report for Application No. GB 1406654.2 dated Mar. 6, 2018.

Combined Search and Examination Report for Application No. GB 1811559.2 dated Aug. 31, 2018, 8 pages.

* cited by examiner

Before (upper) and after (lower) IV measurements for increasing shots at 40mJ/cm2. The data is plotted logarithmically.

ELECTRONIC CIRCUIT AND DATA STORAGE SYSTEM

RELATED APPLICATIONS

This Application is a division of U.S. patent application Ser. No. 15/303,982, filed Oct. 13, 2016, which is a U.S. National Application of PCT/GB2015/051129, filed Apr. 14, 2015, which claims priority to and the benefit of GB 1406654.2, filed Apr. 14, 2014. The disclosures of these earlier applications are incorporated herein by reference in their entirety.

FIELD OF THE INVENTION

The present invention relates to electronic circuits, methods of manufacturing electronic circuits, data storage systems, and methods of storing and reading data.

BACKGROUND TO THE INVENTION

Electronic circuits are, of course, extremely well-known. Typically, an electronic circuit is manufactured in a particular configuration and the subsequent operation of the circuit is determined by that configuration. Typically, no modification of that configuration (and in particular, no modification of individual components) is possible after manufacture. The resistance of resisted elements in such circuits is typically fixed during manufacture, and those resistance values are not modifiable later on.

A wide variety of data storage and retrieval systems are also known, using a wide variety of techniques for storing data on a variety of storage media. There is an on-going need with such systems to find ways in which data may be stored securely, i.e. in a manner such that it is not readily apparent that data has been stored, and furthermore what that data is.

SUMMARY OF THE INVENTION

It is an aim of certain embodiments of the invention to solve, at least partly, one or more of the problems associated with the prior art.

According to a first aspect of the invention there is provided a method of manufacturing an electronic circuit, the method comprising: providing an electronic circuit having a first configuration in which the circuit comprises a resistive element having a first resistance; and irradiating at least a part of said resistive element with electromagnetic radiation to change the resistance of said resistive element from said first resistance to a second resistance, wherein said second resistance is lower than said first resistance.

This technique provides the advantage that the circuit can be modified or tuned after manufacturing the circuit in the first configuration by means of the irradiation, and so the resistance of the resisted element can be tuned, optimised, or otherwise adjusted after the initial part of the manufacturing and hence this can be used to modify the subsequent operation of the circuit. This tuning or modification can be used to correct or adjust resistance values resulting from the first part of the manufacturing process (i.e. which result in the circuit being in the first configuration), or the modification may be used to bring about a substantial and desired change in the operation of the circuit. This modification or tuning of the resistance value can also be achieved without requiring any direct physical contact to be made to the circuit. Also, the resistive element may be embedded, contained, encapsulated, or otherwise provided in a structure and the irradiation may still be able to achieve the desired change in resistance.

In certain embodiments, the electronic circuit comprises electrically insulative material covering at least one side of the resistive element, and said irradiating comprises irradiating said part with electromagnetic radiation through the electrically insulative material.

In such embodiments, the electrically insulative material may be arranged so as to be at least substantially transparent to visible light. Thus, the resistive element may be covered or embedded in transparent material, enabling it to be irradiated through that material so as to achieve the resistance change.

In certain embodiments, the resistive element comprises semiconductive material, and said irradiating is arranged to change a conductivity of the semiconductive material.

In certain embodiments, the resistive element comprises at least a portion of a layer of semiconductive material having a first conductivity, and said irradiating comprises irradiating at least a part of said portion with said electromagnetic radiation to increase the conductivity of said part of said portion (e.g. change the conductivity of said part of said portion from said first conductivity to a second conductivity) such that the resistance of the resistive element changes from said first resistance to said second resistance.

In certain embodiments, the semiconductive material is at least substantially transparent to visible light.

In certain embodiments, the circuit comprises a layer of dielectric material covering said semiconductive material.

In certain embodiments, the dielectric material is substantially transparent to visible light, and the step of irradiating comprises irradiating through the layer of dielectric material.

Thus, the resistive element may comprise or consist of semiconductive material which is itself at least substantially transparent to visible light. The resistive element may also be covered, contained in, or encapsulated by insulating material which is also at least substantially transparent to visible light. Thus, a person looking at the circuit may be able to see through the resistive element and its encapsulation, and furthermore will not be able to perceive any change in the semiconductive material resulting from the irradiation process. Thus, a change in the resistance of the resistive element may be achieved without a person being visually alerted to that change.

In certain embodiments, said irradiating comprises providing said electromagnetic radiation from a laser, and in certain alternative embodiments said irradiating comprises providing said electromagnetic radiation from a lamp. This irradiating may comprise irradiating with at least one pulse of the electromagnetic radiation (whose length, for example, may be controlled to control the dose of radiation supplied to the resistive element), and in certain embodiments the irradiating may comprise irradiating with a plurality of pulses. For example, two pulses of 25 ns or one pulse of 50 ns could be used with similar effect.

In certain embodiments, the plurality of pulses are substantially the same as each other (e.g. having substantially the same duration, substantially the same intensity profile, and substantially the same frequency spectrum).

In certain embodiments, the number of pulses in said plurality of pulses determines the magnitude of the difference between said first resistance and said second resistance.

In certain embodiments the method further comprises selecting the number of said pulses to determine the magnitude of the difference between said first resistance and said second resistance.

Thus, controlling the number of pulses of radiation used to irradiating the resistive element provides the advantage that the magnitude of the resistance change can be controlled, and in certain embodiments may be used to achieve a plurality of different magnitudes of change. Thus, fine control of the tuning or modification of the resistance can be achieved by means of selecting the number of pulses to be applied.

In certain embodiments the method further comprises receiving a piece of data, and selecting said number in accordance with the piece of data, such that the difference between said first and second resistances is indicative of said piece of data.

Thus, the magnitude of the resistance change may be used to carry information.

In certain embodiments, the method further comprises controlling a dose of electromagnetic radiation supplied to the resistive element from the lamp or laser to determine the magnitude of the difference between said first resistance and said second resistance.

In certain embodiments, the method further comprises receiving a piece of data and arranging said dose in accordance with the piece of data, such that the difference between said first and second resistances is indicative of said piece of data.

In certain embodiments, the lamp or the laser provides a beam of said electromagnetic radiation and said controlling comprises controlling at least one of a distance of the resistive element from the lamp or laser and a length of time the resistive element is exposed to said beam.

In certain embodiments, said controlling comprises controlling a speed at which the resistive element is moved through the beam.

In certain embodiments, the method further comprises heating the resistive element to a temperature of at least 100 C (e.g. 150 C) and beginning said irradiating while the resistive element is at said temperature.

In certain embodiments, the circuit is arranged to provide an output dependent on the magnitude of the difference between said first resistance and said second resistance.

In certain embodiments, the circuit further comprises a display element coupled to the resistive element and said irradiating is arranged to determine a state of the display element during an operation of the circuit.

Thus, in certain embodiments the irradiation of the resistive element may be arranged to determine whether the corresponding display element is in an off state or an off state during subsequent operation of the circuit. In this way, the selective irradiation of the resistive element may be used to set or program an output of the circuit.

In certain embodiments, wherein the circuit comprises a plurality of said resistive elements, each resistive element comprising at least a portion of a common or respective layer of semiconductive material, and said irradiating comprises irradiating at least a part of each portion with a selected amount of said electromagnetic radiation.

For example, the circuit may comprise a multi-segment display, with each segment being coupled to a respective resistive element. The selective irradiation of the resistive elements may then be used to select the states of the display segments when the circuit is operated (i.e. whether they are on or off). This can be considered as a form of digital or two-state programming.

In certain embodiments, the electronic circuit is arranged to provide an output dependent on the change in resistance of each resistive element resulting from said irradiating.

In certain embodiments, said circuit is a memory circuit, the second resistance or the difference between the first resistance and the second resistance corresponding to a stored parameter or value. In other words, the change in resistance achieved by the irradiation may be arranged to carry or convey information.

Another aspect of the invention provides a circuit comprising a resistive element and having a first configuration in which the resistive element has a first resistance, the circuit being adapted to enable exposure of at least part of the resistive element to electromagnetic radiation to change the resistance of the resistive element from said first resistance to a second resistance, wherein said second resistance is lower than said first resistance.

For example, this adaption may take the form of arranging the resistive element so that it is covered by, encased in, or encapsulated by substantially transparent electrically insulating material. Then, the resistance of the element may conveniently be modified by irradiating it through that transparent material. The transparent material may, for example, be arranged as a window in an otherwise opaque body of the circuit.

Thus, in certain embodiments the circuit comprises dielectric material at least substantially transparent to visible light and arranged to permit irradiation of said part with said electromagnetic radiation through said dielectric material.

In certain embodiments, the circuit further comprises a display element coupled to the resistive element, the circuit being arranged such that a state of the display element during an operation of the circuit is dependent on whether the resistive element has said first or said second resistance.

In certain embodiments, the resistive element comprises semiconductive material having a conductivity changeable by irradiation with said electromagnetic radiation.

In certain embodiments the semiconductive material is at least substantially transparent to visible light.

Another aspect of the invention provides a method of storing data, the method comprising: receiving a piece of data to be stored; determining (selecting, choosing) a number according to (corresponding to) the piece of data; irradiating at least part of a resistive element with said number of pulses of electromagnetic radiation to change a resistance of the resistive element from a first resistance to a second resistance, wherein the second resistance is lower than the first resistance, and a difference between the first resistance and the second resistance is dependent on (is determined by) said number.

Another aspect provides a method of storing data, the method comprising:

receiving a piece of data to be stored;

determining a dose of electromagnetic radiation according to the piece of data; and irradiating at least part of a resistive element with said dose of electromagnetic radiation to change a resistance of the resistive element from a first resistance to a second resistance, wherein the second resistance is lower than the first resistance, and a difference between the first resistance and the second resistance is dependent on said number.

Another aspect of the invention provides a method of reading data, the method comprising: measuring a resistance or change in resistance of a resistive element; and ascertaining a piece of data according to the measurement.

Another aspect of the invention provides a data storage system comprising: a memory comprising a resistive element; writing means adapted to receive a piece of data, determine a number (integer) according to (corresponding to) the piece of data, and irradiate at least part of said resistive element with said number of pulses of electromagnetic radiation to change a resistance of the resistive element from a first resistance to a second resistance, wherein the second resistance is lower than the first resistance, and a difference between the first resistance and the second resistance is dependent on (is determined by) said number; and reading means adapted to interact with said memory to ascertain said piece of data according to (from) the second resistance of the resistive element (e.g. the reading means may be adapted to measure said second resistance of the resistive element and ascertain said piece of data from (using) a measured value of said second resistance). In other words, the reading means is adapted to interact with said memory and is sensitive to the second resistance to ascertain/recover/read the piece of data.

Another aspect provides a data storage system comprising:

a memory comprising a resistive element;

writing means adapted to receive a piece of data, determine a dose of electromagnetic radiation according to the piece of data, and irradiate at least part of said resistive element with said dose of electromagnetic radiation to change a resistance of the resistive element from a first resistance to a second resistance, wherein the second resistance is lower than the first resistance, and a difference between the first resistance and the second resistance is dependent on said number; and reading means adapted to interact with said memory and being sensitive to the second resistance to ascertain said piece of data.

In certain embodiments, the writing means comprises a radiation source, for example a laser or a lamp, arranged to emit a beam of said electromagnetic radiation.

In certain embodiments the system further comprises support means adapted to support the memory during said irradiation, wherein the support means is controllable to adjust at least one of a separation between the resistive element and a position of the resistive element relative to the beam.

In certain embodiments the system further comprises a controller arranged to control the radiation source and the support means.

Thus, in certain embodiments the reading means interacts with the memory so as to obtain an indication of the second resistance and/or of the change in resistance, and from that indication may deduce/ascertain the piece of data.

Thus, the change in resistance "written" on the memory by the writing means carries information, and that information is then recovered by the reading means which is sensitive to the resistance of the resistive element.

BRIEF DESCRIPTION OF THE DRAWINGS

Embodiments of the invention will now be described with reference to the accompanying drawings, in which.

DETAILED DESCRIPTION

Figure 1:
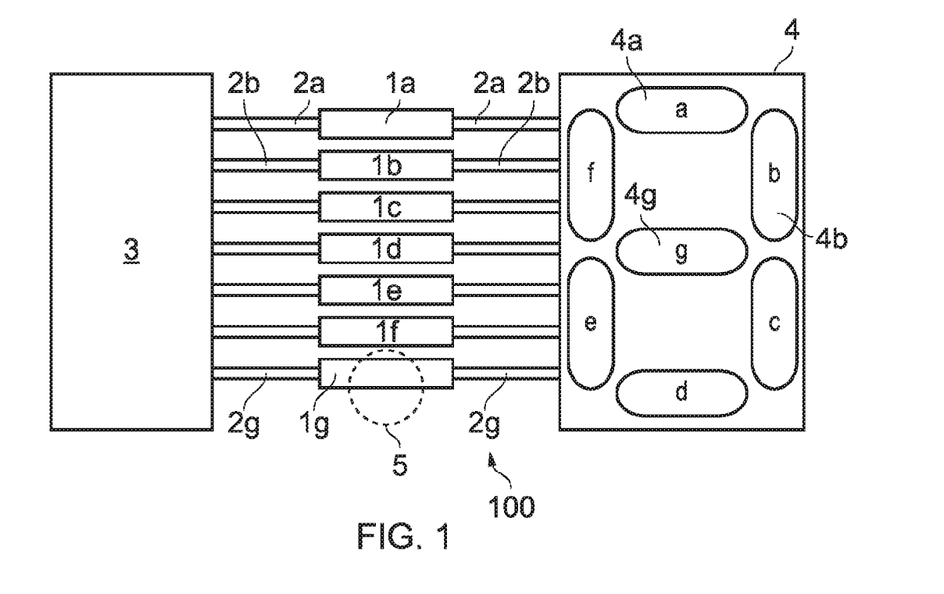
FIG. 1 is a schematic representation of an electronic circuit embodying the invention.

Referring now to FIG. 1, this is a schematic representation of an electronic circuit embodying the invention. The circuit 100 comprises a plurality of resistive elements 1 $a$-1 $g$, with each resistive element consisting of a thin, substantially planar rectangular layer of semiconductive/semiconductor material. The circuit further comprises drive circuitry 3 and a 7-segment display 4, comprising 7 individually controllable display segments 4$a$-4$g$. Each resistive element 1$a$-1$g$ is coupled/connected to a respective one of the display segments 4$a$-4$g$ by a conductive track 2$a$ (which in this example is provided by a thin layer of metallic material, for example gold, silver, aluminium, copper, and each resistive element 1$a$-1$g$ is also coupled to the drive circuitry 3 by means of a respective further conductive track 2$a$-2$g$. Each resistive element 1$a$-1$g$ is arranged such that, before irradiation, its resistance is sufficiently high that, during operation of the circuit, its respective display segment is in the off state. Thus, the initial, relatively high resistance of each resistive element prevents the drive circuitry from powering the respective display segments to the "on" condition. Thus, when the circuit 100 is in its first configuration, each of the display segments 4$a$-4$g$ is off when the circuit operates. The circuit can effectively be programmed to give a desired output from the 7-segment display 4 by means of selective irradiation of one or more of the resistive elements 1$a$-1$g$. In other words, in a method embodying the invention one or more selected resistive elements may be irradiated with electromagnetic radiation so as to increase the conductivity of the semiconductive material and so reduce the resistance of the resistive element. The degree of irradiation may be arranged such that the decrease in resistance is sufficient to enable the drive circuitry, during operation, to illuminate, or otherwise switch on the display element or elements corresponding to the irradiated resistive element or elements. In FIG. 1, a laser beam is shown generally be broken line 5 and irradiates part of resistive element 1$g$. This would result, during operation of the circuit, in display element 4$g$ being illuminated. Thus, in methods embodying the invention a single laser beam may be used to selectively and sequentially irradiate a plurality of the resistive elements to create a desired output on the display when the circuit is operated. In alternative embodiments, a plurality of laser beams or pulses, or a plurality of portions of a single laser beam or pulse, can be used to irradiate the selected resistive elements in parallel (i.e. at the same time).

Figure 2:
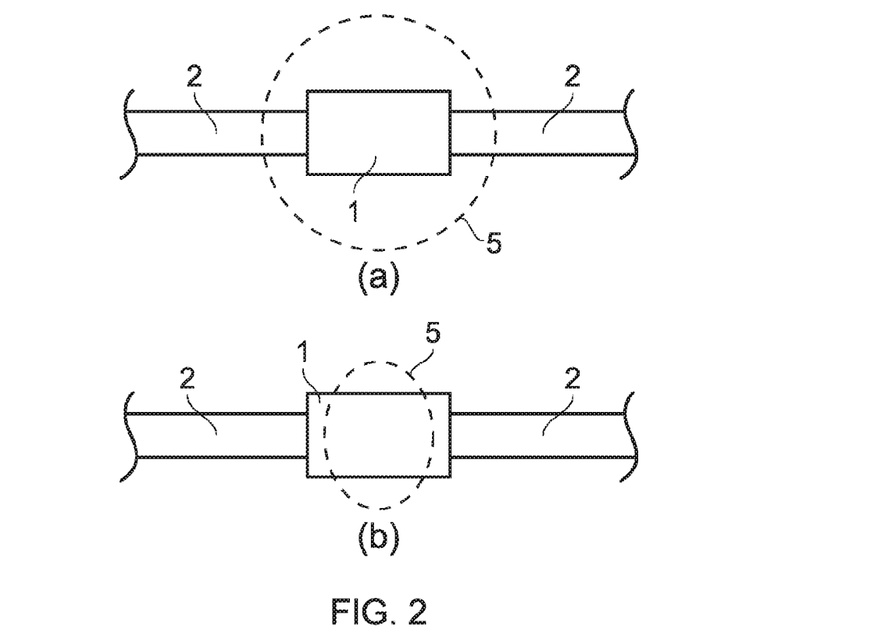
FIG. 2 illustrates the irradiation of resistive elements in embodiments of the invention.

Moving on to FIG. 2, this shows two irradiation techniques which may be employed in embodiments of the invention. In FIG. 2$a$, a laser pulse, whose cross section or extent is shown by broken line 5, covers the entire resistive element 1, which provides a resistive connection between conductive tracks 2 on either side. Thus, in this technique the irradiation is arranged so as to change the connectivity of the entire resistive element, which again in this example is provided by a body (e.g. layer) of semiconductor material. FIG. 2b shows an alternative technique in which the size of the laser beam or pulse 5 is arranged so as to cover just a part or portion of the resistive element 1.

Figure 3:
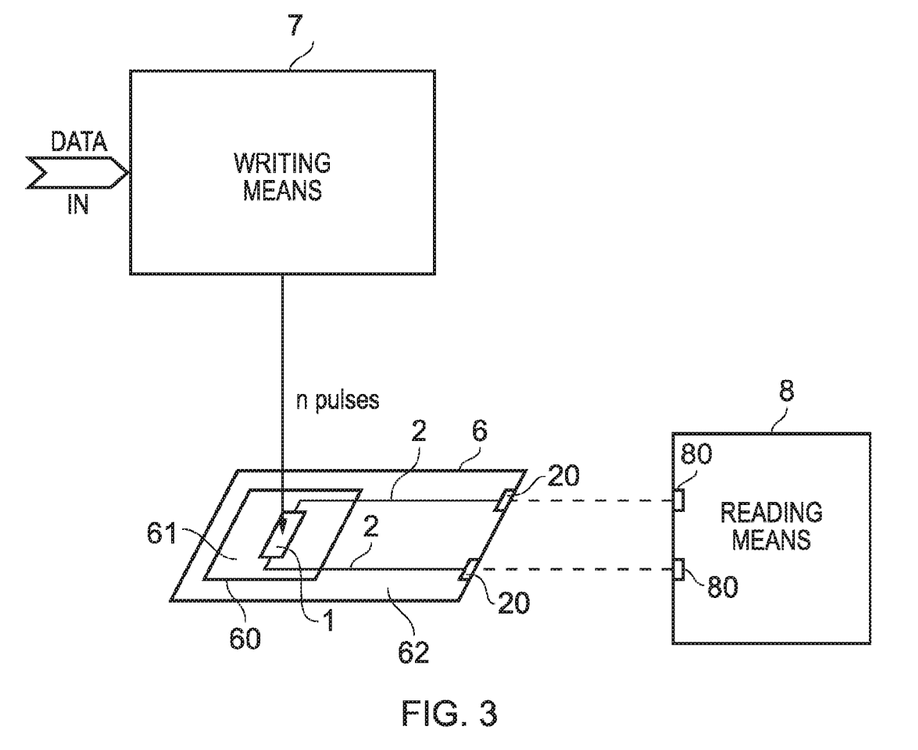
FIG. 3 is a schematic representation of a data storage and retrieval system embodying the invention.

Referring now to FIG. 3, this shows in highly schematic form a data storage system embodying the invention. The system comprises a memory generally in the form of a card 6 having an opaque portion 62 and a transparent window 60. Visible inside the window is a resistive element 1, which in this example is also formed of material that is substantially transparent to visible light. A layer of transparent material 61 covers the upper surface of the resistive element 1, and in other examples the resistive element 1 may be encapsulated in transparent material inside the window 60. Conductive tracks 2 connect respective ends of the resistive element 1 to respective contacts or contact pads 20 of the memory card 6. The system also comprises writing means 7 which is adapted to receive data and then irradiate the resistive element 1 (in a write operation) with a number of pulses of laser radiation, where the number n is selected in accordance with the piece of data to be "written" to the memory card 6. In other words, there is a correspondence between the number of irradiating pulses applied to the element 1 and the data to be encoded or carried. The irradiation of the element 1 with the n pulses of radiation results in a resistance change of the element 1, the magnitude of that resistance change thus being indicative of the piece of data. The system further comprises reading means 8 which itself comprises contacts or terminals 80 adapted to form electrical connections to the contact pads 20 of the card 6. Thus, the writing means is able to encode a piece of received data in the form of a resistance change of the element 1 on the card. Then, the reading means is brought into engagement with the card 6 (with pads 80 contacting pads 20) and the reading means is arranged to determine the piece of data written on the card by means of measuring, or otherwise responding to the changed resistance of the element 1. Clearly, in such systems embodying the invention, the writing means and reading means are adapted to implement the same coding system, so that when the reading means interacts with the card 6 it is sensitive to the resistance of the element 1 so as to be able to determine what the piece of data was that caused the writing means to apply the appropriate number of pulses of radiation to the element 1 to achieve the final (second) resistance. In a simple example, the reading means may be adapted to measure the resistance of the resistive element 1. Effectively, the reading means can then compare the measured resistance with a look-up table (or use a hardware equivalent) to see what data the resistance corresponds to. Clearly, in alternative embodiments other means of "recovering" the encoded data, according to the resistance of the element 1 that has been "written" on the card, may be employed.

Figure 4:
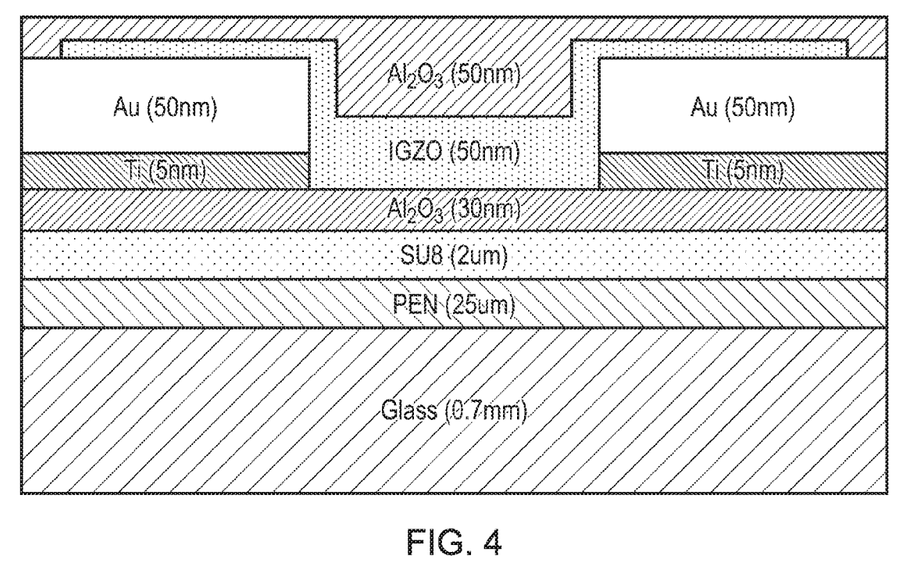
FIG. 4 illustrates the structure of part of an electronic circuit or memory embodying the invention.

Referring now to FIG. 4, this shows part of a circuit or memory embodying the invention and whose conductivity has been modified in techniques embodying the invention. The illustrated structure includes a resistive element in the form of a layer of semiconductive material (IGZO). The structure of FIG. 4 was manufactured with the gold contacts forming conductive tracks connecting to the resistive element (IGZO). Experiments have demonstrated that the IGZO conductivity can be modified post-process. Such irradiation can be arranged to selectively "hard wire" part of a display on (or off) when the resistive element is used in a circuit such as that shown in FIG. 1. Referring again to FIG. 1, the metal tracking 2 has a break in it which is replaced or bridged by semiconductor. In certain embodiments of the invention, some of the semiconductor tracking then has its conductivity modified so that chosen display segments are turned on (or off).

When the structure shown in FIG. 4 was irradiated, changes to the semiconductor conductivity that were achieved were both permanent and invisible to the naked eye (and were also invisible under a microscope). Such techniques embodying the invention can also be used to produce resistors within a circuit by selecting the size of the semiconductor pad.

In one experiment performed on the structure shown in FIG. 4, a 248 nm laser was employed, the laser having a 25 ns pulse width and the spot had a uniform top-hat profile. The spot size was 1 cm×1 cm. Such a large area allowed a useful number of test devices to be irradiated simultaneously, but in certain embodiments of the invention the spot size may be much smaller in order to reduce the circuit footprint.

In one experiment, the IGZO layer was 50 nm thick, which was chosen to match the penetration depth of the laser at 248 nm. A thinner IGZO layer could be used if the wavelength of the exposure source were reduced further (e.g. 20 nm film thickness with 172 nm illumination has also been proven).

It will be appreciated that the thicknesses of the various layers/elements of the structure of FIG. 4 are merely examples, and different thicknesses/dimensions may be employed in alternative embodiments. For example, the IGZO may have a thickness in the range 20-100 nm, or 10-100 nm. The Al2O3 layer may be produced by sputtering, and may have a thickness in the range 20-100 nm (e.g. 30 nm, 50 nm). Generally, the thickness of IGZO that can be accommodated is dependent on wavelength. At 248 nm, thicknesses above 50 nm can be irradiated successfully. At 172 nm the thickness can be decreased to at least 20 nm. The upper thickness limit is not yet known, but eventually the lamp will not penetrate far enough to convert the IGZO.

Figure 5:
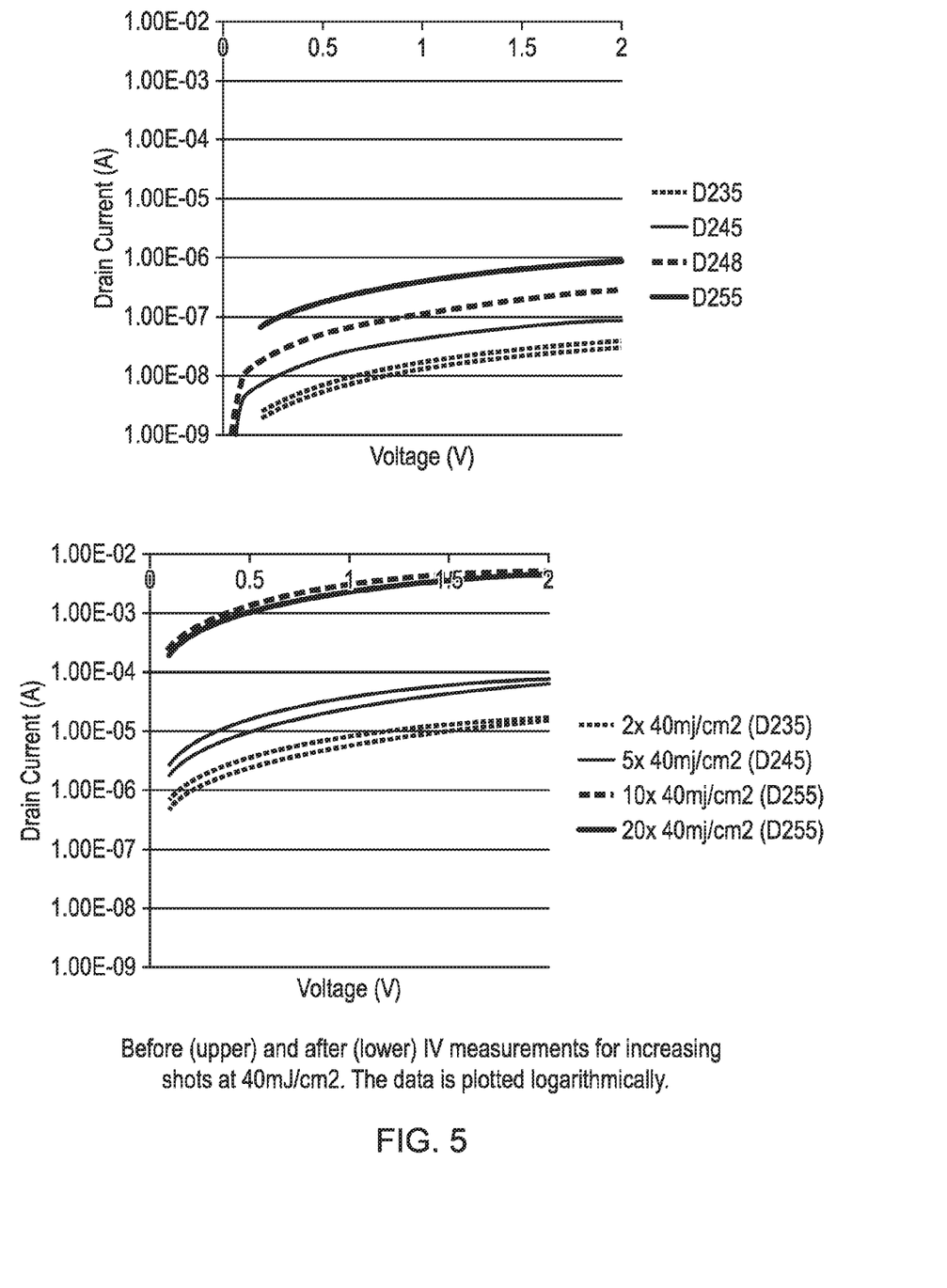
FIG. 5 illustrates the changes in resistance of resistive elements achieved using methods embodying the invention.

Two experiments were conducted. Firstly some devices were irradiated at 55 mJ/cm2 in an attempt to ablate the IGZO and thereby eliminate any conductivity. Secondly some devices were irradiated with multiple shots at 40 mJ/cm2 to try and improve the conductivity to a useable level, without showing any visible change to the devices. Examination of the areas irradiated at 40 mJ/cm2 confirmed that there was no visible damage to the devices. The before and after IVs are shown in FIG. 5.

Although there was some variation in the initial IV measurement, the irradiated areas showed a marked increase in conductivity, especially at 10× and 20× shot number, where 4 orders of magnitude change was observed.

In order to achieve more than 4 orders of magnitude change then one can consider altering film thickness, and whether the thickness could be reduced to lower the 'off' conductivity without also reducing the 'on' conductivity.

Examination of the areas irradiated at 55 mJ/cm2 showed that it was the unprotected gold which ablated and not the IGZO. However, areas of gold under the IGZO remained, whereas those directly on the substrate did not. This is presumably associated with the absorption of the light by the IGZO in the IGZO covered areas.

Figure 6:
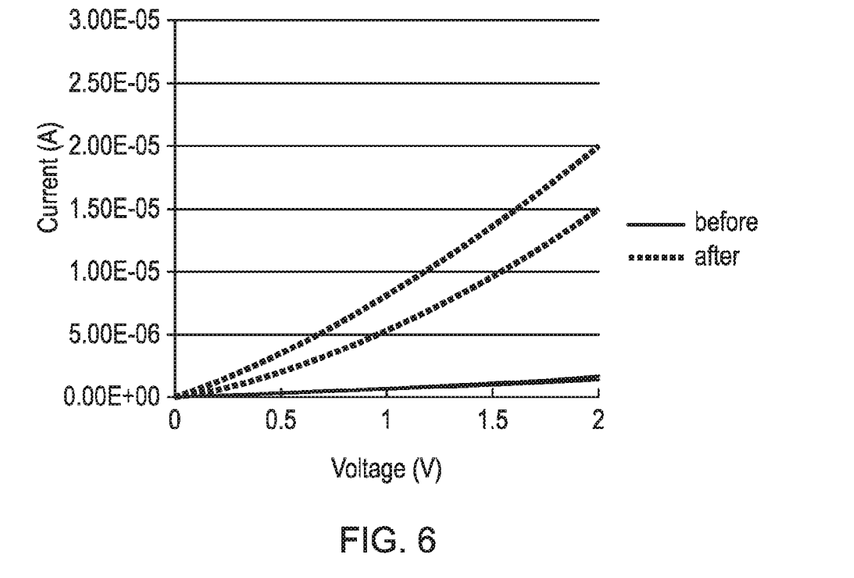
FIG. 6 is another representation of the changes in resistance of a resistive element achieved in certain embodiments of the invention.

FIG. 6 shows the IV characteristics for a structure as shown in FIG. 4 irradiated once at 55 mJ/cm2. This confirms that 55 mJ/cm2 is insufficient to remove the IGZO from the substrate, and also correlates with the approximate 1 order of magnitude increase when only 1 shot is used. Had the IGZO been removed then it is expected that the current would have fallen to zero.

Some conclusions from the experimental work are that: increasing the number of shots at 40 mJ/cm2 significantly improves the current by >4 orders of magnitude (i.e. decreases the resistance of the resistive element by more than 4 orders of magnitude); reducing the film thickness may help to reduce the initial current and thereby increase the on/off ratio but the impact of reduced thickness on the 'on' conductivity would have to be examined; and the fluence could be increased to at least 55 mJ/cm2 without ablating the IGZO.

It will be appreciated that certain embodiments of the invention are able to provide one or more of the following features/advantages:

Programming electronic ID/functionality without physical contact to the circuit (e.g. after embedding in a card)

Programming electronic ID/functionality "securely" (i.e. in transparent material with no visible or structural change to the material)

Programming high density memory for printed electronics (<10 sq.um per memory element)

As an extension of the above, programming multiple "bits" per memory element (using different number of laser shots to change resistivity along a pre-determined spectrum)

Tuning/optimising resistor values (e.g. being able to achieve a wide range of resistance values, and/or being able to achieve a more accurate resistance by integrating laser tuning into the measurement/QA process after circuit production).

Figure 7:
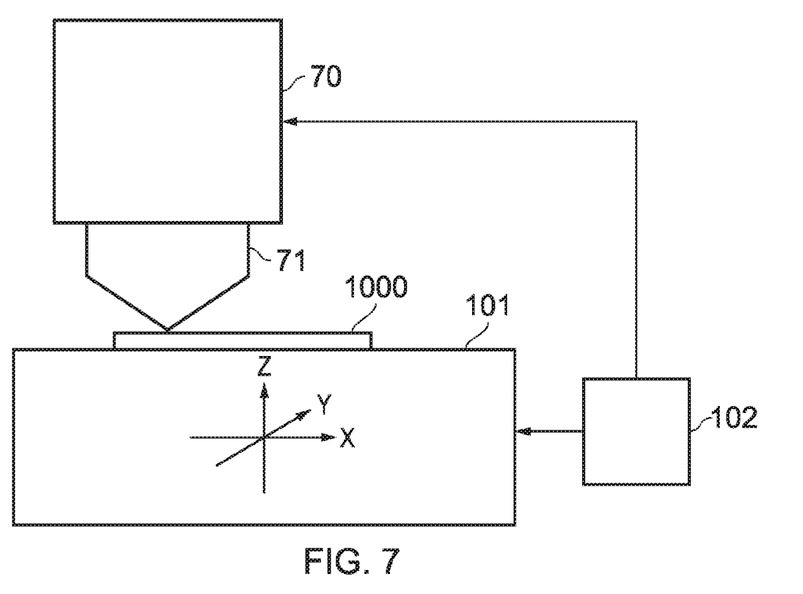
FIG. 7 illustrates apparatus, usable in embodiments of the invention, which was used to irradiate wafers comprising resistive elements to illustrate resistance changes achievable in embodiments of the invention.

Referring now to FIG. 7, this shows apparatus which may be used in embodiments of the invention to irradiate resistive elements. The apparatus was used to irradiate wafers 1000 which comprised resistive elements, to demonstrate resistance changes achievable in embodiments of the invention. Transport properties of resistive elements processed with this apparatus are shown in the subsequent figures.

The apparatus comprises an illumination/radiation source 70 arranged to output a beam 71 of electromagnetic radiation. In one example, the source 70 was a lamp, outputting a relatively wide and non-uniform beam, but in other embodiments the source may be a lamp providing a narrower and/or uniform beam, or a laser. The apparatus comprises a support 101 (which may also be described as a stage) adapted to support the wafer 1000 (or equivalently a circuit 100 or memory 6) during the irradiating process. The support 101 is controllable to move the supported item in at least one of three directions (and in this example is controllable to move in three mutually perpendicular directions, nominally the X, Y, and Z directions). The support 101 may be described as an X-Y stage, adapted to enable a translation/sweep/scan speed over a range of values (e.g. 1-10 cm/min) and further adapted to enable lamp to substrate separation to be varied over a range of values (e.g. 1-10 mm). A controller 102 is arranged to control both the source 70 and the support 101 so as to control the dose of radiation supplied to the resistive element or elements. Thus, the controller in this example can control the stage 101 to set the distance between the wafer and source (i.e. control how close they are positioned), and to set a speed at which the wafer is moved through the beam (so that, even with a non-uniform beam, each part of the wafer can receive the same dose of radiation). Thus, the stage can be controlled to scan the wafer through the beam. In alternative embodiments, the controller and stage may be adapted to permit fine positioning of the or each resistive element relative to a narrow beam, to provide the ability for selective irradiation of one or more selected resistive elements.

Figure 8:
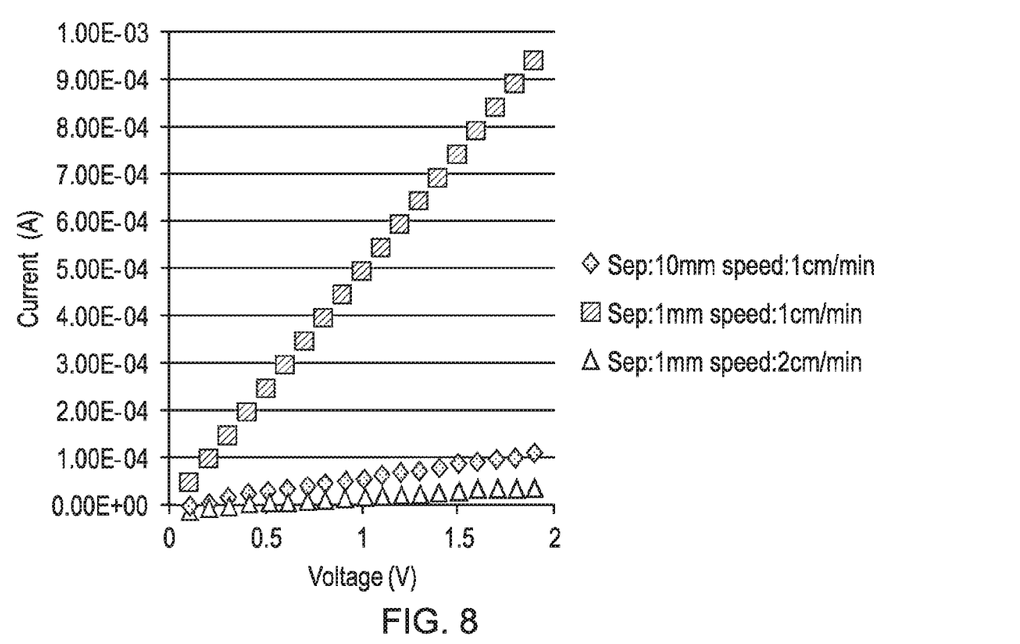
FIGS. 8 to 11 illustrate measurements results for wafers incorporating resistive elements irradiated using the apparatus of FIG. 7.
Figure 9:
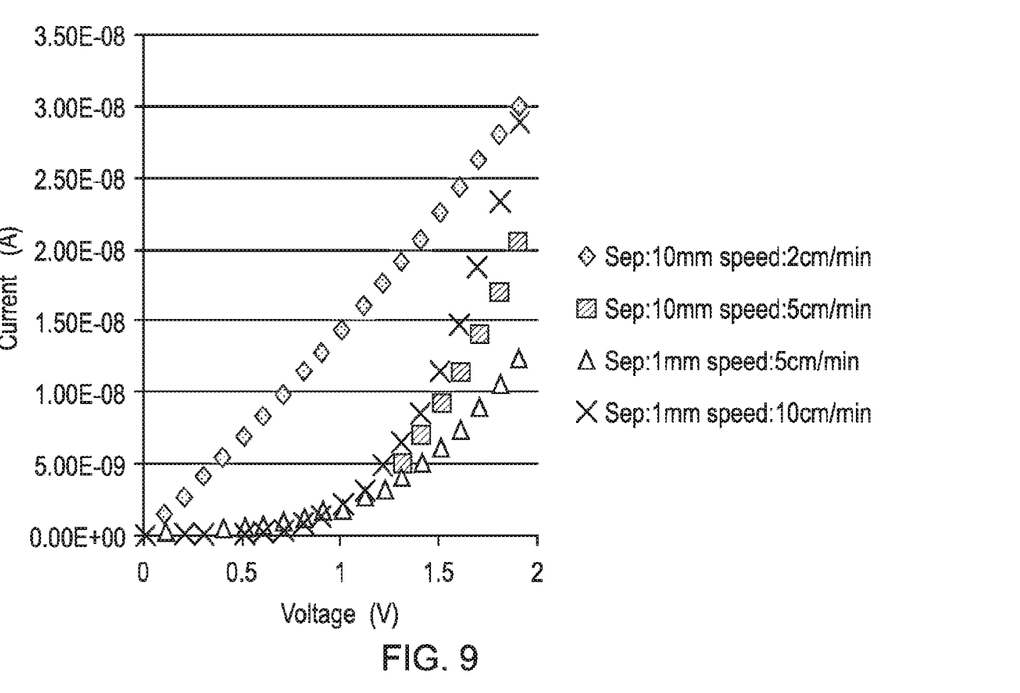

In certain experiments, using apparatus generally as shown in FIG. 7, the irradiation was performed using a lamp 70 with a wavelength (i.e. nominal output wavelength) of 172 nm. Irradiation intensities between 1.6 W/cm and 15 W/cm were used successfully. The lamp was non-uniform in output so the wafer has to be passed under the lamp with a stage in order that the wafer all saw the same irradiation level. In these experiments, wafers 1001 were passed under a lamp of wavelength 172 nm with different lamp to wafer separations and speeds of motion under the lamp. The graphs in FIGS. 8 and 9 show the current vs. voltage characteristics of the resistive elements so irradiated. Higher speeds and greater separation yield resistive elements that are much more resistive than those irradiated at lower speeds and smaller separation (i.e. much less current flows for a given driving voltage). In FIGS. 8 and 9 the data is plotted linearly.

Figure 10:
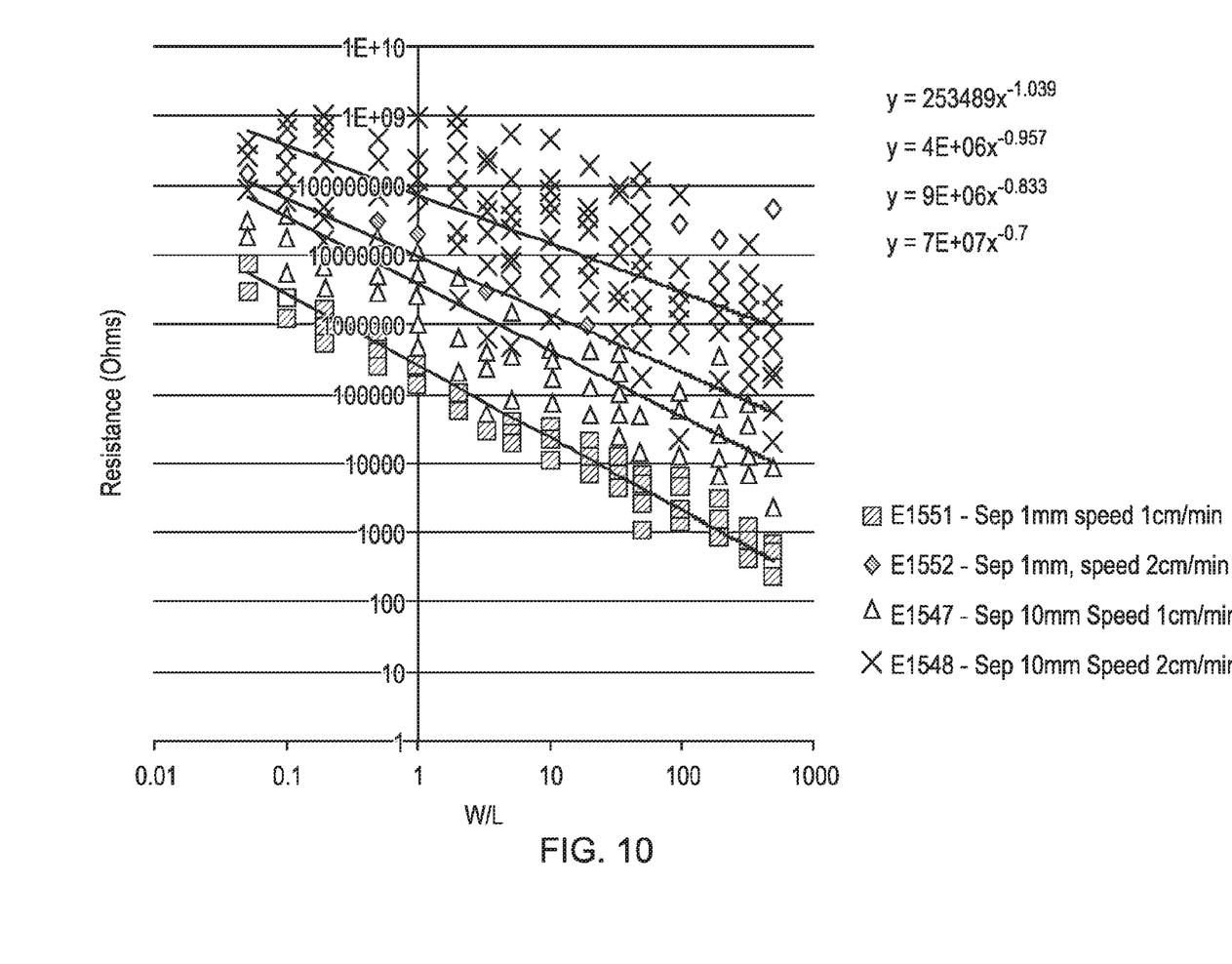

FIG. 10 shows essentially the same data as FIGS. 8 and 9, but for a plurality of different resistor geometries tested. In other words, the general irradiating technique was used to irradiate a plurality of different resistive element geometries, and FIG. 10 shows the resultant measured resistances as a function of resistor geometry for different separations (wafer-lamp) and speeds (translation through the beam) under the 172 nm lamp. All follow the expected $1/x$ dependence on W/L, where W is width and L is length of the resistive element (which may be generally rectangular, and of generally uniform thickness).

Figure 11:
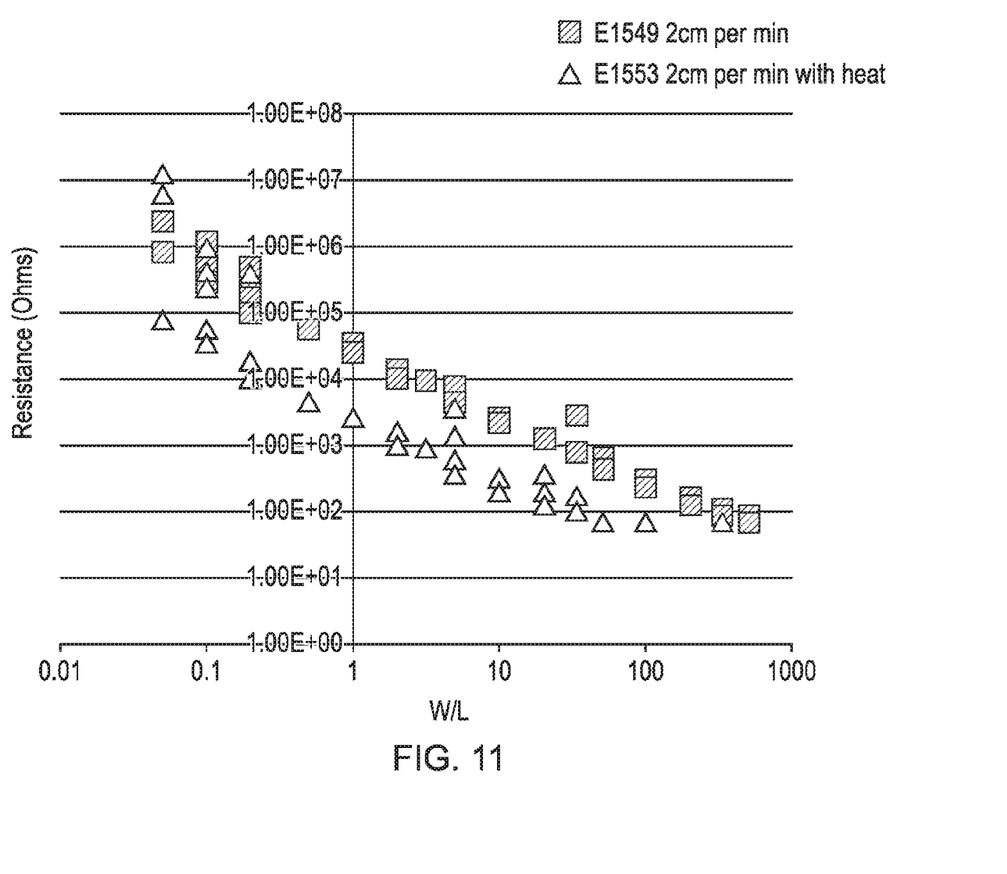

The lamp's effectiveness can be increased by increasing the temperature of the substrate (150 C in one experiment) at the same time as doing the irradiation. The effects of pre-heating the wafer (which could also be performed on a circuit or memory in embodiments of the invention) in this way (i.e. heating to 150 C before beginning irradiating) are illustrated by the results presented in FIG. 11. Resistance is plotted as a function of resistor geometry. Again it follows the expected $1/x$ dependence on W/L but eventually the IGZO conductivity is so high that the resistor performance is dominated by the intrinsic contact resistance between the IGZO and the gold, which in certain embodiments may be 0.04 Ohms/um, but may be different in alternative embodiments.

Figure 12:
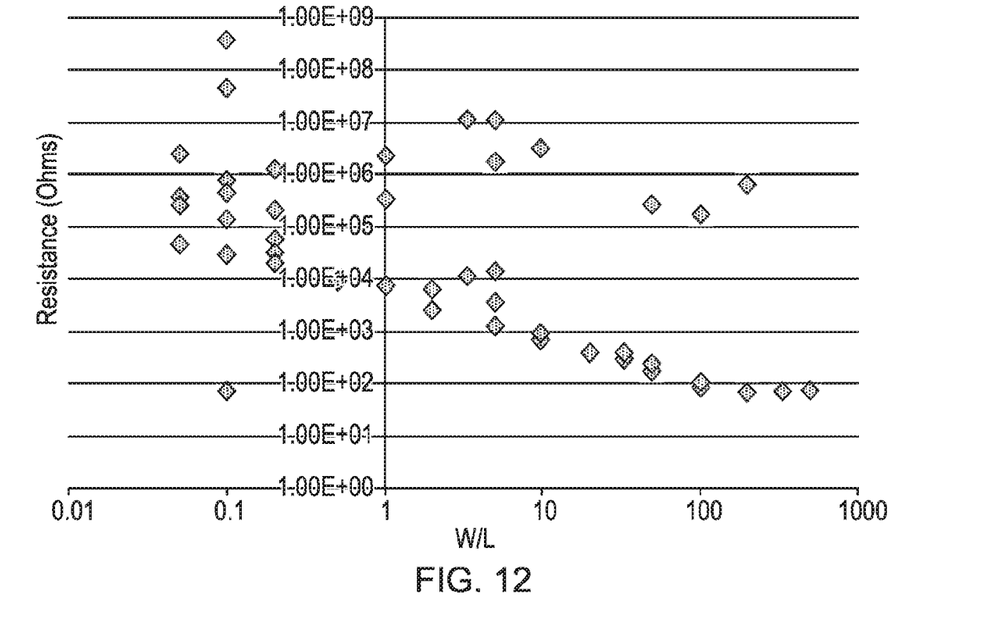
FIGS. 12 and 13 illustrate measurement results for resistive elements irradiated using laser shots and using lamp irradiation, respectively, for comparison.
Figure 13:
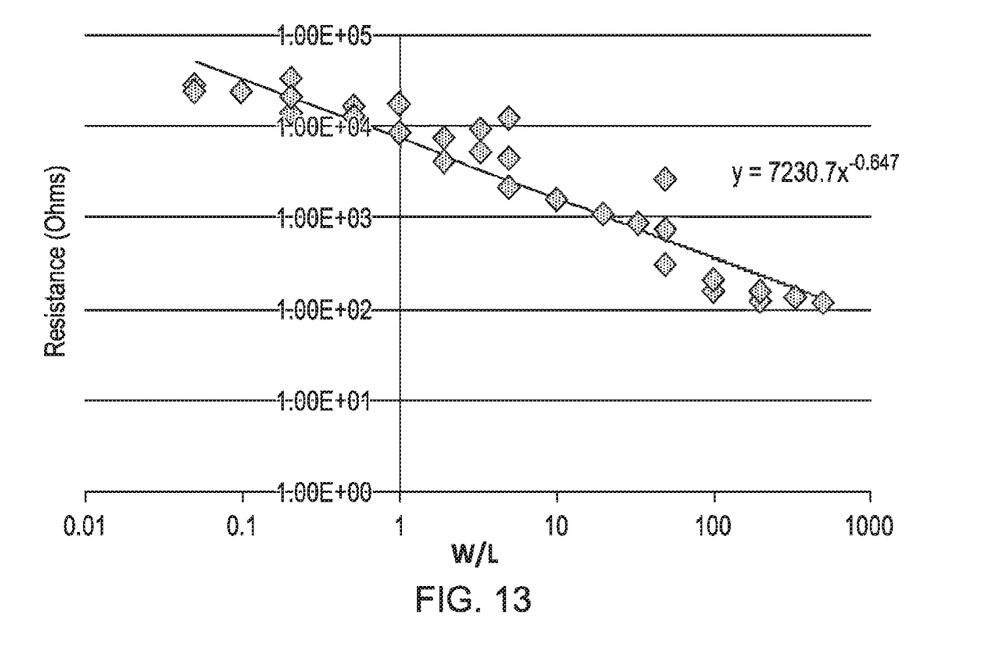

FIGS. 12 and 13 are useful to compare laser and lamp processing on the same wafer. Both show results for a wafer comprising IGZO (50 nm thick), with resistance plotted as a function of resistor geometry, showing the expected $1/x$ dependence. FIG. 12 shows the results of irradiation by laser, with 10 shots (i.e. pulses) at 70 mJ/cm2, and FIG. 13 shows the results of irradiation by lamp, wavelength 172 nm, and 20 minutes exposure. The results are broadly similar with both processes.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A method of manufacturing an electronic circuit, the method comprising:
    providing an electronic circuit having a first configuration in which the circuit comprises an electrically resistive element having a first resistance; and
    irradiating at least a part of said electrically resistive element with electromagnetic radiation to change the resistance of said electrically resistive element from said first resistance to a second resistance, wherein said second resistance is lower than said first resistance
    wherein the electrically resistive element comprises semiconductive material, and said irradiating is arranged to increase a conductivity of the semiconductive material such that the resistance of the electrically resistive element changes from said first resistance to said second resistance.

2. A method in accordance with claim 1, wherein the electronic circuit comprises electrically insulative material covering at least one side of the electrically resistive element, and said irradiating comprises irradiating said part with electromagnetic radiation through the electrically insulative material.

3. A method in accordance with claim 2, wherein the electrically insulative material is at least substantially transparent to visible light.

4. A method in accordance with claim 1, wherein the semiconductive material is at least substantially transparent to visible light.

5. A method in accordance with claim 1, wherein the circuit comprises a layer of dielectric material covering said semiconductive material.

6. A method in accordance with claim 5, wherein the dielectric material is substantially transparent to visible light, and the step of irradiating comprises irradiating through the layer of dielectric material.

7. A method in accordance with claim 1, wherein the electrically resistive element is encased in material at least substantially transparent to visible light, and said irradiating comprises irradiating through said material at least substantially transparent to visible light.

8. A method in accordance with claim 1, wherein said irradiating comprises providing said electromagnetic radiation from a laser or a lamp.

9. A method in accordance with claim 1, wherein said irradiating comprises irradiating with at least one pulse of said electromagnetic radiation.

10. A method in accordance with claim 9, further comprising selecting the number of said pulses to determine the magnitude of the difference between said first resistance and said second resistance.

11. A method in accordance with claim 10, further comprising receiving a piece of data, and selecting said number in accordance with the piece of data, such that the difference between said first and second resistances is indicative of said piece of data.

12. A method in accordance with claim 8, further comprising controlling the dose of electromagnetic radiation supplied to the electrically resistive element from the lamp or laser to determine the magnitude of the difference between said first resistance and said second resistance.

13. A method in accordance with claim 12, further comprising receiving a piece of data and arranging said dose in accordance with the piece of data, such that the difference between said first and second resistances is indicative of said piece of data.

14. A method in accordance with claim 12, wherein the lamp or the laser provides a beam of said electromagnetic radiation and said controlling comprises controlling at least one of a distance of the electrically resistive element from the lamp or laser and a length of time the electrically resistive element is exposed to said beam.

15. A method in accordance with claim 14, wherein said controlling comprises controlling a speed at which the electrically resistive element is moved through the beam.

16. A method in accordance with claim 1, further comprising heating the electrically resistive element to a temperature of at least 100 C and beginning said irradiating while the electrically resistive element is at said temperature.

17. A method in accordance with claim 1, wherein the circuit is arranged to provide an output dependent on the magnitude of the difference between said first resistance and said second resistance.

18. A method in accordance with claim 1, wherein the circuit further comprises a display element coupled to the electrically resistive element and said irradiating is arranged to determine a state of the display element during an operation of the circuit.

19. A method in accordance claim 1, wherein the circuit comprises a plurality of said electrically resistive elements, each electrically resistive element comprising at least a portion of a common or respective layer of semiconductive material, and said irradiating comprises irradiating at least a part of each portion with a selected amount of said electromagnetic radiation.

20. A method in accordance with claim 19, wherein the electronic circuit is arranged to provide an output dependent on the change in resistance of each electrically resistive element resulting from said irradiating.

21. A method in accordance with claim 1, wherein said circuit is a memory circuit, the second resistance or the difference between the first resistance and the second resistance corresponding to a stored parameter or value.

22. A method of manufacturing an electronic circuit, the method comprising:
    providing an electronic circuit having a first configuration in which the circuit comprises an electrically resistive element having a first resistance; and
    irradiating at least a part of said electrically resistive element with electromagnetic radiation to change the resistance of said electrically resistive element from said first resistance to a second resistance, wherein said second resistance is lower than said first resistance, wherein the electrically resistive element comprises at least a portion of a layer of semiconductive material having a first conductivity, and said irradiating comprises irradiating at least a part of said portion with said electromagnetic radiation to increase the conductivity of said part of said portion such that the resistance of the electrically resistive element changes from said first resistance to said second resistance.

* * * * *